United States Patent
Kocon et al.

(10) Patent No.: US 6,673,681 B2
(45) Date of Patent: Jan. 6, 2004

(54) PROCESS FOR FORMING MOS-GATED POWER DEVICE HAVING SEGMENTED TRENCH AND EXTENDED DOPING ZONE

(75) Inventors: Christopher B. Kocon, Plains, PA (US); Thomas E. Grebs, Mountaintop, PA (US); Joseph L. Cumbo, West Wyoming, PA (US); Rodney S. Ridley, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/174,641

(22) Filed: Jun. 19, 2002

(65) Prior Publication Data

US 2002/0175412 A1 Nov. 28, 2002

Related U.S. Application Data

(60) Division of application No. 09/689,939, filed on Oct. 12, 2000, now Pat. No. 6,433,385, which is a continuation-in-part of application No. 09/314,323, filed on May 19, 1999, now Pat. No. 6,198,127.

(51) Int. Cl.$^7$ ............................................... H01L 29/76
(52) U.S. Cl. ..................... 438/270; 438/259; 257/328; 257/329; 257/330
(58) Field of Search ................. 438/259, 270; 257/328, 329, 330

(56) References Cited

U.S. PATENT DOCUMENTS

| | | | | | |
|---|---|---|---|---|---|
| 4,893,160 | A | * | 1/1990 | Blanchard | 257/334 |
| 5,216,275 | A | | 6/1993 | Chen | |
| 5,438,215 | A | | 8/1995 | Tihanyi | |
| 5,442,214 | A | * | 8/1995 | Yang | 257/328 |
| 5,473,176 | A | * | 12/1995 | Kakumoto | 257/192 |
| 5,637,898 | A | * | 6/1997 | Baliga | 257/330 |
| 6,198,127 | B1 | * | 3/2001 | Kocon | 257/328 |
| 6,262,453 | B1 | * | 7/2001 | Hshieh | 257/341 |
| 6,433,385 | B1 | * | 8/2002 | Kocon et al. | 257/328 |

* cited by examiner

*Primary Examiner*—Richard Elms
*Assistant Examiner*—Christian D. Wilson
(74) *Attorney, Agent, or Firm*—Thomas R. FitzGerald, Esq.

(57) ABSTRACT

A process for constructing a trench MOS-gated device includes: forming in a semiconductor substrate an extended trench that comprises an upper segment and a bottom segment, wherein the bottom segment has a lesser width relative to a greater width of the trench upper segment and extends to a depth corresponding to the total depth of the extended trench. The bottom segment of the trench is substantially filled with dielectric material. The trench upper segment has a floor and sidewalls comprising dielectric material and is substantially filled with a conductive material to form a gate region. A heavily doped source region of the first conduction type and a heavily doped body region of the second conduction type are formed in a surface well region on the side of the extended trench opposite an extended doped zone.

13 Claims, 3 Drawing Sheets

PROCESS FOR FORMING MOS-GATED POWER DEVICE HAVING SEGMENTED TRENCH AND EXTENDED DOPING ZONE

CROSS-REFERENCE TO RELATED APPLICATION

This application is a divisional of U.S. patent application Ser. No. 09/689,939, filed Oct. 12, 2000, now U.S. Pat. No. 6,433,385 which is a continuation-in-part of Ser. No. 09/314,323 filed May 19, 1999 now U.S. Pat. No. 6,198,127, issued Mar. 6, 2001 for MOS-GATED POWER DEVICE HAVING EXTENDED TRENCH AND DOPING ZONE AND PROCESS FOR FORMING SAME, the disclosure of which is incorporated herein by reference.

FIELD OF THE INVENTION

The present invention relates to semiconductor devices and, more particularly, to a trench MOS-gated power device having a segmented trench and an extended doping zone, and a process for forming such a device.

BACKGROUND OF THE INVENTION

An MOS transistor having a trench gate structure offers important advantages over a planar transistor for high current, low voltage switching applications. The DMOS trench gate typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOS channel extending along the vertical sidewalls of the trench from the bottom of the source across the body of the transistor to the drain below. Channel density is thereby increased, which reduces the contribution of the channel to on-resistance. The structure and performance of trench DMOS transistors are discussed in Bulucea and Rossen, "Trench DMOS Transistor Technology for High-Current (100 A Range) Switching," in *Solid-State Electronics*, 1991, Vol. 34, No. 5, pp 493–507, the disclosure of which is incorporated herein by reference. In addition to their utility in DMOS devices, trench gates are also advantageously employed in insulated gate bipolar transistors (IGBTs), MOS-controlled thyristors (MCTs), and other MOS-gated devices.

FIG. 1 schematically depicts the cross-section of a trench-gated N-type MOSFET device 100 of the prior art formed on an upper layer 101a of an N+ substrate 101. Device 100 includes a trench 102 whose sidewalls 103 and floor 104 are lined with a gate dielectric such as silicon dioxide. Trench 102 is filled with a conductive material 105 such as doped polysilicon, which serves as an electrode for gate region 106.

Upper layer 101a of substrate 101 further includes P-well regions 107 overlying an N-drain zone 108. Disposed within P-well regions 107 at an upper surface 109 of upper layer 101a are heavily doped P+ body regions 110 and heavily doped N+ source regions 111. An interlevel dielectric layer 112 is formed over gate region 106 and source regions 111. Contact openings 113 enable metal layer 114 to contact body regions 110 and source regions 111. The rear side 115 of N+ substrate 101 serves as a drain.

Although FIG. 1 shows only one MOSFET, a typical device currently employed in the industry consists of an array of them arranged in various cellular or stripe layouts. As a result of recent semiconductor manufacturing improvements enabling increased densities of trench gated devices, the major loss in a device when in a conduction mode occurs in its lower zone, i.e., increased drain resistivity. Because the level of drain doping is typically determined by the required voltage blocking capability, increased drain doping for reducing resistivity is not an option. Thus, there is a need for reducing the resistivity of the drain region in a semiconductor device without also reducing its blocking capability. The present invention meets this need.

SUMMARY OF THE INVENTION

The present invention is directed to a trench MOS-gated device that comprises a doped monocrystalline semiconductor substrate that includes an upper layer and is of a first conduction type. An extended trench in the substrate in the upper layer comprises two segments having differing widths relative to one another: a bottom segment of lesser width filled with a dielectric material, and an upper segment of greater width lined with a dielectric material and substantially filled with a conductive material, the filled upper segment of the trench forming a gate region.

An extended doped zone of a second opposite conduction type extends from an upper surface into the upper layer of the substrate only on one side of the trench, and a doped well region of the second conduction type overlying a drain zone of the first conduction type is disposed in the upper layer on the opposite side of the trench. The drain zone is substantially insulated from the extended zone by the dielectric-filled bottom segment of the trench.

A heavily doped source region of the first conduction type and a heavily doped body region of the second conduction type is disposed at the upper surface of the well region only on the side of said trench opposite doped extended zone. An interlevel dielectric layer is disposed on the upper surface overlying the gate and source regions, and a metal layer disposed on the upper surface of the upper layer and the interlevel dielectric layer is in electrical contact with the source and body regions and the extended zone.

The present invention is further directed to a process for constructing a trench MOS-gated device that comprises: providing a substrate having an upper surface and comprising doped monocrystalline semiconductor material of a first conduction type, and forming a trench in an upper layer of the substrate. The trench has a floor and sidewalls and further has a width and extends to a depth substantially corresponding to a width and a depth of the upper segment of an extended trench that comprises an upper segment and a bottom segment.

A masking oxide layer is formed on the substrate upper layer and on the trench floor and sidewalls and anisotropically etched to remove it from the trench floor and thereby form an opening to substrate semiconductor material underlying the floor. The semiconductor material underlying the trench floor is etched to form the bottom segment of the extended trench. The bottom segment has a lesser width relative to a greater width of the trench upper segment and extends to a depth corresponding to the total depth of the extended trench.

The remaining masking oxide layer is removed from the substrate upper layer and the trench sidewalls, and the extended trench is substantially filled with a dielectric material. A dopant of a second opposite conduction type is implanted and diffused into the upper layer on one side of the extended trench, thereby forming a doped extended zone extending into the upper layer from its upper surface. The dielectric material is selectively removed from the upper segment of the extended trench, leaving the bottom segment of the trench substantially filled with dielectric material. A floor and sidewalls comprising dielectric material are formed in the trench upper segment, which is then substantially filled with a conductive material to form a gate region.

A doped well region of the second conduction type is formed in the upper layer of the substrate on the side of the extended trench opposite the doped extended zone. A heavily doped source region of the first conduction type and a heavily doped body region of the second conduction type are formed in the well region at the upper surface of the upper layer. An interlevel dielectric layer is deposited on the upper surface overlying the gate and source regions, and a metal layer is formed over the upper surface and the interlevel dielectric layer, the metal layer being in electrical contact with the source and body regions and the extended zone.

DETAILED DESCRIPTION OF THE INVENTION

Figure 1:
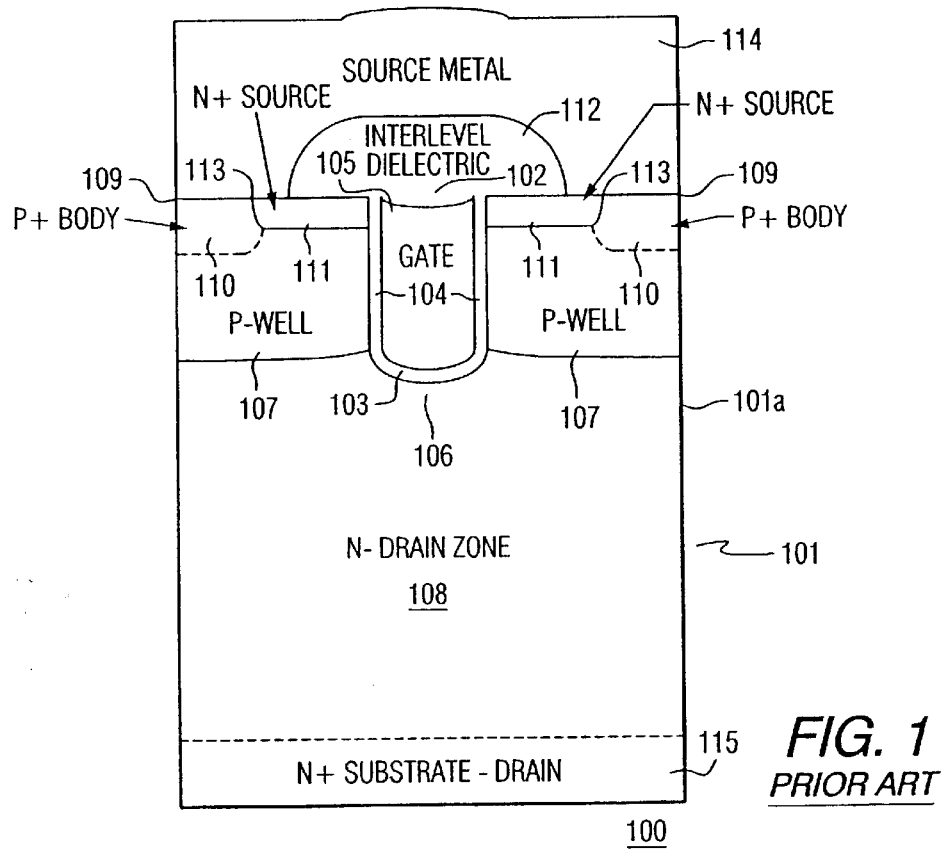
FIG. 1 schematically depicts a cross-section of a trench MOS-gated device 100 of the prior art.
Figure 2:
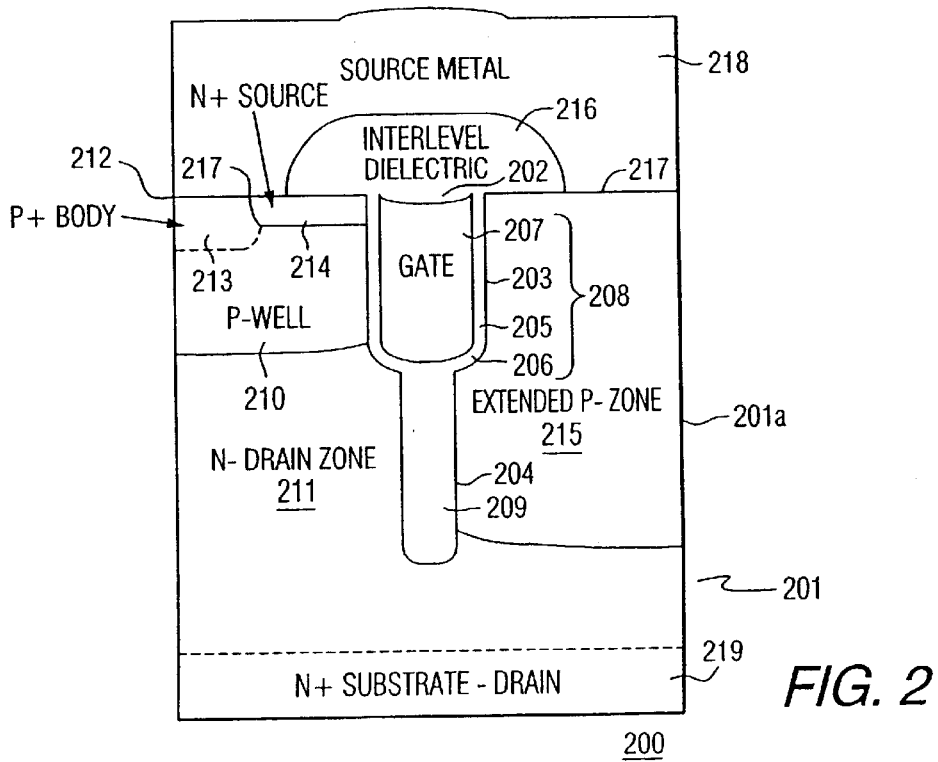
FIG. 2 is a schematic cross-sectional representation of a trench MOS-gated device 200 of the present invention, and FIGS. 2A–H schematically depict a process for forming device 200 in accordance with the invention. The drawings are not necessarily to scale.

In FIG. 2 is schematically depicted the cross-section of an MOS-gated power device 200 of the present invention. In an upper layer 201a of a substrate 201 is constructed an extended trench 202 that comprises an upper segment 203 and a bottom segment 204. Upper segment 203 of extended trench 202 is lined with dielectric sidewalls 205 and floor 206 and is filled with a conductive material 207 to form a gate region 208. Bottom segment 204, whose width is less than that of upper segment 203, is substantially filled with a dielectric material 209, which can be silicon dioxide. The dielectric material included in sidewalls 205 and floor 206 of trench upper segment can also be silicon dioxide, and conductive material 207 can be doped polysilicon.

The widths of trench upper and bottom segments 203 and 204, respectively, are preferably in a ratio of about 1.2:1 to about 12:1, more preferably, a ratio of about 10:1. The depth of upper segment 203 and the total depth of extended trench 202 are in a ratio of, preferably, about 1:2 to about 1:8, more preferably, about 1:5.

On one side of extended trench 202 is a P-well region 210 overlying an N-drain zone 211. Disposed within P-well region 210 at upper surface 212 is a heavily doped P+ body region 213 and a heavily doped N+ source region 214. On the other side of extended trench 202 is an extended P-zone 215. Extended trench 202 separates extended zone 215 from drain zone 211, which are of opposite conduction types. An interlevel dielectric layer 216 is formed over gate region 208, source region 214, and extended P-zone 215. Contact openings 217 enable metal layer 218 to contact body, source, and gate regions 213, 214, and 208, respectively. The rear side 219 of substrate 201 serves as a drain.

Extended P-zone 215 serves to deplete charge when blocking voltage is applied, allowing a much higher conductivity material to be used for drain construction and thereby reducing the on-resistance of the device and improving its efficiency. Dielectric material 209 in trench lower segment 204 prevents lateral diffusion of dopants from extended P-zone 215 into N-drain zone 211. Extended P-zone 215, which is thus self-aligned with gate region 208, is shorted to source region 214 by metal layer 218. Self-alignment allows the use of structure 200 for making high density devices with blocking voltage capabilities well below 100 V. Since dielectric material 209 serves only as a barrier to dopant diffusion, its quality is not important to the performance of device 200, which would still function even if zones 211 and 215 were electrically shorted through dielectric material 209. When device 200 is in the blocking state, zones 211 and 215 will contribute charges with opposite signs, but the induced fields in both zones cancel one another, allowing the use of much higher doping for extended P-zone 215 and particularly for N-drain zone 211. The reduced width of trench bottom segment 204, increases the conduction current path width when device 200 is in the conduction state. Current flowing through drain zone 211 thereby undergoes a much lower resistance drop, which in turn reduces the device overall on-resistance and improves its efficiency.

Although the described device is an N-channel silicon device, the present invention can also be applied to other devices and other semiconductor materials and dopants. For example, the described conduction types can be reversed, N for P and P for N. The described device is a power MOSFET, but the present invention is contemplated as applying to all MOS-gated devices such as, for example, IGBTs and MCTs.

Figure 2A:
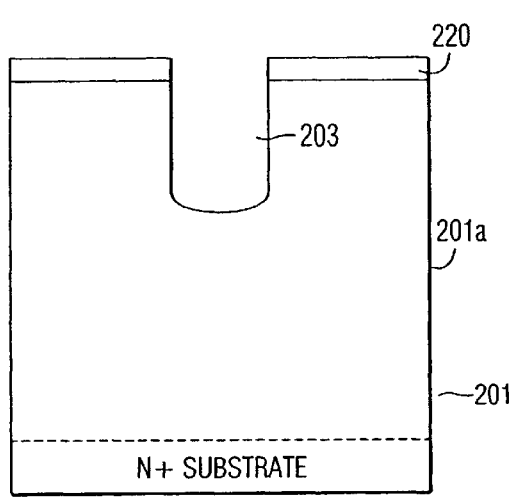

A process for making MOS-gated device 200 of the present invention is schematically depicted in FIGS. 2A–H. As shown in FIG. 2A, a masking dielectric layer 220, low temperature oxide (LTO), for example, is deposited on upper layer 201a of substrate 201. Layers 220 and 201a are patterned and etched by means well-known in the art to form trench upper segment 203.

Figure 2B:
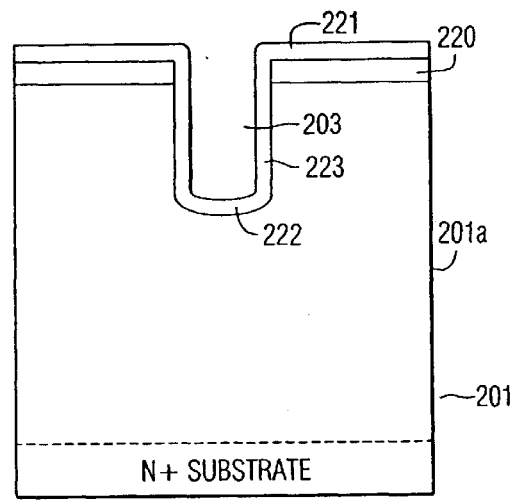
Figure 2C:
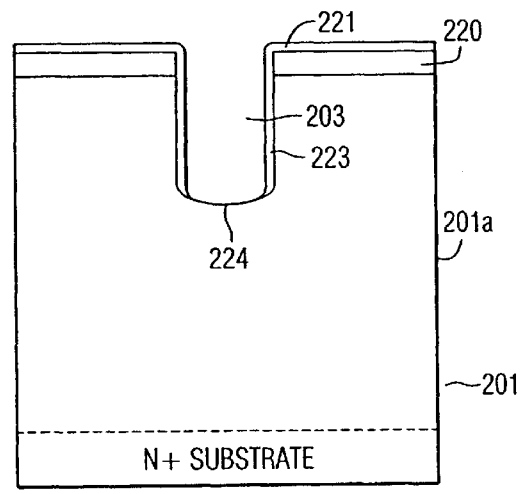

As shown in FIG. 2B, a conformal masking oxide layer 221 is deposited or grown on masking dielectric layer 220 and on floor 222 and sidewalls 223 of trench upper segment 203, then anisotropically etched to remove oxide from floor 222 and form an opening 224 to underlying layer 201a, depicted in FIG. 2C. In addition to forming opening 224, anisotropic etching results in thinning of the horizontal portions of oxide layer 221 overlying dielectric layer 220.

Figure 2D:
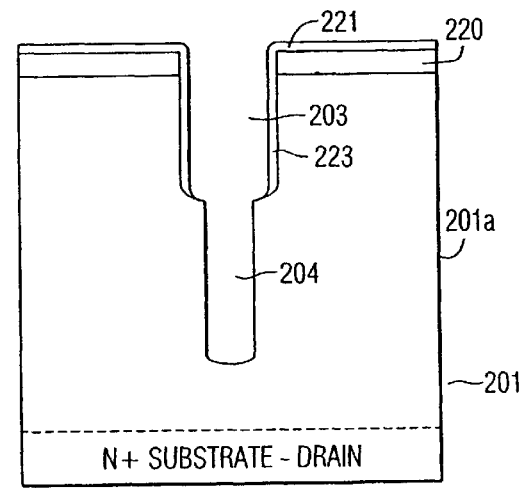
Figure 2E:
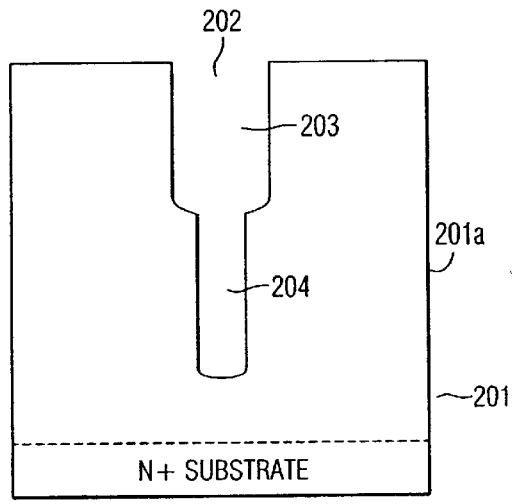
Figure 2F:
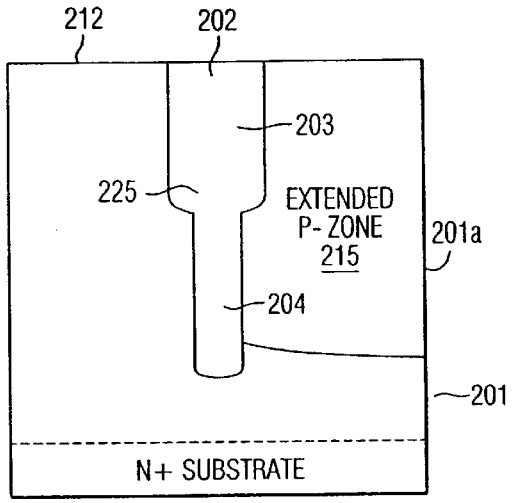

Layer 201a is etched through opening 224 to form trench bottom segment 204, as shown in FIG. 2D. Then, as depicted in FIG. 2E, the remaining portions of masking dielectric layer 220 and conformal masking oxide layer 221 are removed by etching to form extended trench 202. As shown in FIG. 2F, extended trench 202 is substantially filled with dielectric material 225, preferably oxide. A planarization etch step can be used to planarize dielectric material 225 with upper surface 212 of upper layer 201a. A P-dopant is selectively implanted, using standard photolithography techniques, on one side of trench 202. High temperature diffusion drives the dopant deep into layer 201a, thereby forming extended P-zone 215.

Figure 2G:
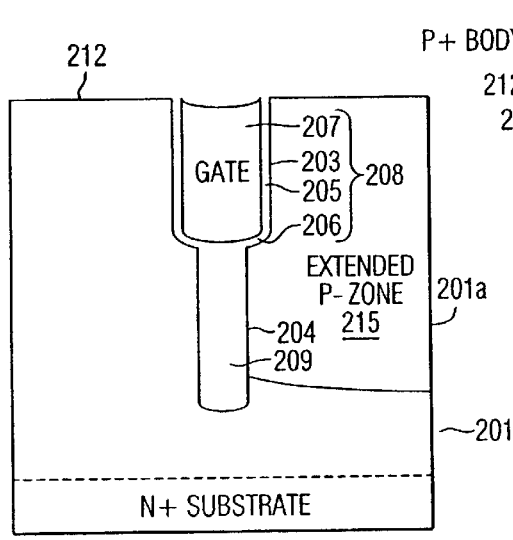

Dielectric material 225 is removed, using dry etching techniques, from trench upper segment 203, leaving trench bottom segment substantially filled with oxide dielectric 209. Dielectric oxide sidewalls 205 and floor 206 are formed in trench upper segment 203, which is then substantially filled with conductive polysilicon 207 to form gate region 208, as shown in FIG. 2G.

Figure 2H:
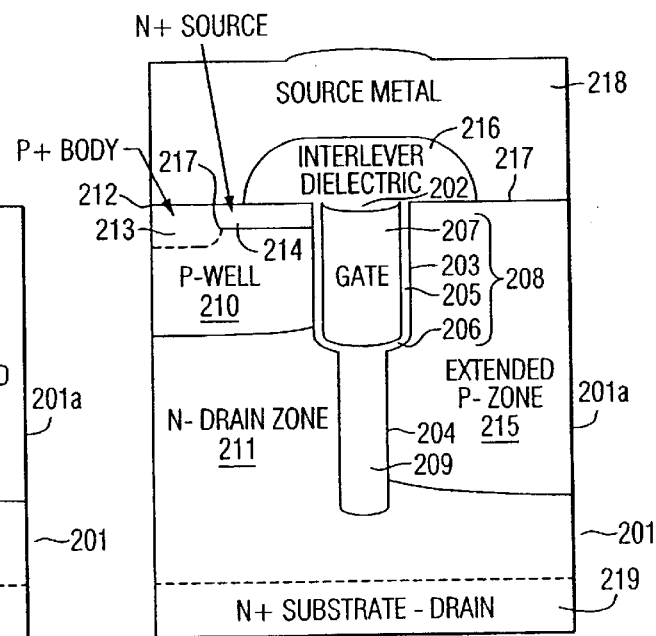

P-well region 210 is implanted into upper layer 201a on the side of trench 202 opposite that of extended P-zone 215, and P+ body region 213 and N+ source region 214 are implanted into well region 210. Deposition of interlevel dielectric layer 216 and metal layer 218 and formation of contact openings 217 completes the fabrication of device 200, as depicted in FIG. 2H.

Variations of the described specific process flow are contemplated as being within the present invention. The sequence of trench creation, implantation and etch, for example, can be altered without affecting the final device function and layout.

Although the embodiment described above is an MOS power device, one skilled in the art may adapt the present invention to other devices, including insulated gate bipolar transistors and MOS-controlled thyristors.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A process for forming a trench MOS-gated device, said process comprising:
   providing a substrate having an upper surface and comprising doped monocrystalline semiconductor material of a first conduction type;
   forming a trench in an upper layer of said substrate, said trench having a floor and sidewalls, said trench further having a width and extending to a depth substantially corresponding to a width and a depth of the upper segment of an extended trench comprising an upper segment and a bottom segment;
   forming a conformal masking oxide layer on said substrate upper layer and on said trench floor and sidewalls;
   anisotropically etching said conformal masking oxide layer, thereby removing said masking oxide from said trench floor and forming an opening to substrate semiconductor material underlying said floor;
   etching said semiconductor material underlying said trench floor, thereby forming said bottom segment of said extended trench, said bottom segment having a lesser width relative to a greater width of said trench upper segment and extending to a depth corresponding to the total depth of said extended trench;
   removing remainder of conformal masking oxide layer from said substrate upper layer and from said trench sidewalls;
   substantially filling said extended trench with a dielectric material;
   selectively implanting and diffusing a dopant of a second opposite conduction type into said upper layer on one side of said extended trench, thereby forming an extended zone extending from said substrate upper surface into said upper layer;
   selectively removing said dielectric material from said upper segment of said extended trench, leaving said bottom segment of said extended trench substantially filled with said dielectric material;
   forming floor and sidewalls comprising dielectric material in said upper segment of said extended trench and substantially filling said upper segment with a conductive material, thereby forming a gate region in said upper segment of said extended trench;
   forming a doped well region of said second conduction type in said upper layer on the side of said extended trench opposite said extended zone;
   forming a heavily doped source region of said first conduction type and a heavily doped body region of said second conduction type in said well region at said upper surface;
   forming an interlevel dielectric layer on said upper surface overlying said gate and source regions; and
   forming a metal layer overlying said upper surface and said interlevel dielectric layer, said metal layer being in electrical contact with said source and body regions and said extended zone.

2. The process of claim 1 further comprising:
   forming a doped drain zone of said first conduction type extending through said upper layer and into said substrate beneath said well region and said extended zone.

3. The process of claim 1 wherein said widths of said trench upper segment and said trench bottom segment are in a ratio of about 1.2:1 to about 12:1.

4. The process of claim 1 wherein said trench upper segment and said extended trench each extend to a selected depth, said depths of said upper segment and said extended trench being in a ratio, relative to one another, of about 1:2 to about 1:8.

5. The process of claim 1 wherein said upper layer is an epitaxial layer.

6. The process of claim 1 wherein said substrate comprises monocrystalline silicon.

7. The process of claim 1 wherein said dielectric material comprises silicon dioxide.

8. The process of claim 1 wherein said conductive material in said trench comprises doped polysilicon.

9. The process of claim 1 wherein said first conduction type is N and said second conduction type is P.

10. The process of claim 1 further comprising:
    forming a plurality of extended trenches in said substrate.

11. The process of claim 10 wherein said plurality of extended trenches have an open-cell stripe technology.

12. The process of claim 10 wherein said plurality of extended trenches have a closed-cell cellular topology.

13. The process of claim 1 wherein said device is selected from the group consisting of a power MOSFET, an insulated gate bipolar transistor, and an MOS-controlled thyristor.

* * * * *